(12) United States Patent
Zhang et al.

(10) Patent No.: US 6,921,671 B1
(45) Date of Patent: Jul. 26, 2005

(54) BUFFER LAYERS TO ENHANCE THE C-AXIS GROWTH OF $Bi_4Ti_3O_{12}$ THIN FILM ON HIGH TEMPERATURE IRIDIUM-COMPOSITE ELECTRODE

(75) Inventors: Fengyan Zhang, Vancouver, WA (US); Wei-Wei Zhuang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/784,669

(22) Filed: Feb. 23, 2004

(51) Int. Cl.[7] ............................................. H01L 21/00
(52) U.S. Cl. .......................................... 438/3; 438/686
(58) Field of Search ........................... 438/3, 240, 253, 438/254, 396, 397, 398, 608, 653, 686, 706

(56) References Cited

U.S. PATENT DOCUMENTS

| | | | |
|---|---|---|---|
| 6,190,963 B1 | * | 2/2001 | Zhang et al. ............... 438/254 |
| 6,236,113 B1 | * | 5/2001 | Zhang et al. ............... 257/757 |
| 6,288,420 B1 | * | 9/2001 | Zhang et al. ............... 257/295 |
| 6,630,702 B2 | * | 10/2003 | Zhang et al. ............... 257/295 |
| 6,759,252 B2 | * | 7/2004 | Zhang et al. ............... 438/3 |

OTHER PUBLICATIONS

Kijima et al., *Preparation of $Bi_4Ti_3O_{12}$ thin films on Si (100) using $Bi_2SiO_5$ buffer layer and its electric characterization*, J. Appl. Phys. vol. 37, Pt 1, 9B, 5171 (1998).

Nakamura et al., *Preparation of C–axis–oriented $Bi_4Ti_3O_{12}$ thin films by metalorganic chemical vapor deposition*, Jpn. J. Phys. vol. 32, 4086 (1993).

* cited by examiner

Primary Examiner—David Nhu
(74) Attorney, Agent, or Firm—David C. Ripma; Joseph P. Curtin

(57) ABSTRACT

A method of fabricating a ferroelectric thin film on an iridium-composite electrode in an integrated circuit device includes preparing a substrate; depositing an iridium-composite bottom electrode on the substrate; annealing the bottom electrode in a first annealing step; depositing a buffer layer on the bottom electrode, including depositing a layer of material taken from the group of materials consisting of $HfO_2$, $ZrO_2$, $TiO_2$, $LaO_x$, La—Al—O, Ti—Al—O, Hf—Al—O, Zr—Al—O, Hf—Zr—O, Zr—Ti—O, Hf—Ti—O, La—Zr—O, La—Hf—O, and La—Ti—O; annealing the buffer layer in a second annealing step; depositing a layer of $Bi_4Ti_3O_{12}$, to a thickness of between about 20 nm to 500 nm, on the buffer layer; annealing the ferroelectric layer in a third annealing step; and completing the integrated circuit device.

16 Claims, 2 Drawing Sheets

BUFFER LAYERS TO ENHANCE THE C-AXIS GROWTH OF $Bi_4Ti_3O_{12}$ THIN FILM ON HIGH TEMPERATURE IRIDIUM-COMPOSITE ELECTRODE

FIELD OF THE INVENTION

This invention relates to semiconductor buffer layers, and specifically to a method which inserts a buffer layer between iridium-composite electrodes and $Bi_4Ti_3O_{12}$ (BTO) thin films to enhance the C-axis growth of BTO thin film for nonvolatile memory devices, DRAMs, capacitors, pyroelectric infrared sensors, optical displays, optical switches, piezoelectric transducers, and surface acoustic wave devices applications.

BACKGROUND OF THE INVENTION $Bi_4T_3O_{12}$ (BTO) is a ferroelectric material that has a typical perovskite layered structure and strong anisotropic properties. The spontaneous polarization, Ps, and the coercive field, Ec, of the crystal along the C-axis are 4 $\mu C/cm^2$ and 3.5 kV/cm, respectively. The spontaneous polarization and coercive field of the crystal along the a-axis is 50 $\mu C/cm^2$ and 50 kV/cm, respectively. The dielectric constants of the BTO thin film are 130 and 160 long C-axis and A-axis respectively. Therefore, C-axis BTO is more suitable for FET type of nonvolatile memory applications.

C-axis BTO thin film has been successfully grown on substrates, such as Pt, $Bi_2SiO_5$ and $Bi_2Ti_2O_7$ buffer layer, however, because the processing temperature of BTO thin film is very high, e.g., 700° C. to 800° C., the stability of a bottom electrode on which the BTO film is grown is important in order to integrate the MFM capacitor into devices. A platinum/titanium bottom electrode usually has severe hillock growth and exhibits peeling during high temperature annealing.

U.S. Pat. No. 6,288,420, to Zhang et al., granted Sep. 11, 2001, for *Composite iridium-metal-oxygen barrier structure with refractory metal companion barrier*, describes use of an iridium-composite electrode which remains conductive, not peeling or forming hillocks, during high temperature annealing processes, even in oxygen.

U.S. Pat. No. 6,236,113, to Zhang et al., granted May 22, 2001, for *Iridium composite barrier structure and method for same* describes use of an iridium-combination film to prevent oxygen diffusion, and which is resistant to high temperature annealing in oxygen environments.

U.S. Pat. No. 6,190,963, Zhang et al., granted Feb. 20, 2001, for *Composite iridium-metal-oxygen barrier structure with refractory metal companion barrier and method for same* describes use of an Ir—M—O composite film which is useful in forming an electrode of a ferroelectric capacitor, where M includes a variety of refractory metals. The Ir combination film is resistant to high temperature annealing in oxygen environments.

Kijima et al., *Preparation of $Bi_4Ti_3O_{12}$ thin films on Si (100) using $Bi_2SiO_5$ buffer layer and its electric characterization*, J. Appl. Phys. Vol 37, Pt 1, 9B, 5171 (1998), describes preparation of a BTO layer by MOCVD on a silicon substrate and on a buffer layer of $Bi_2SiO_5$ on silicon.

Nakamura et al,, *Preparation of C-axis-oriented $Bi_4Ti_1O_{12}$ thin films by metalorganic chemical vapor deposition*, Jpn. J. Phys. Vol. 32, 4086 (1993), describes formation of a BTO thin film on various non-iridium-containing substrates.

SUMMARY OF THE INVENTION

A method of fabricating a ferroelectric thin film on an iridium-composite electrode in an integrated circuit device includes preparing a substrate; depositing an iridium-composite bottom electrode on the substrate; annealing the bottom electrode in a first annealing step; depositing a buffer layer on the bottom electrode, including depositing a layer of material taken from the group of materials consisting of $HfO_2$, $ZrO_2$, $TiO_2$, $LaO_x$, La—Al—O, Ti—Al—O, Hf—Al—O, Zr—Al—O, Hf—Zr—O, Zr—Ti—O, Hf—Ti—O, La—Zr—O, La—Hf—O, and La—Ti—O; annealing the buffer layer in a second annealing step; depositing a layer of $Bi_4Ti_3O_{12}$, to a thickness of between about 20 nm to 500 nm, on the buffer layer; annealing the ferroelectric layer in a third annealing step; and completing the integrated circuit device.

It is an object of the invention to provide a method of growing a buffer layer first on an iridium-composite bottom electrode before growing a BTO thin film thereon, in order to enhance the growth of C-axis BTO thin film.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

C-axis $Bi_4Ti_3O_{12}$ (BTO) thin film has been grown on an $HfO_2$ insulator layer. An iridium-composite high temperature electrode is described herein which maintains its structural stability and conductivity during high temperature annealing in oxygen ambient, however, after depositing the BTO thin film on one of the iridium-composite electrodes, Ir—Ta—O, the BTO thin film exhibited amorphous rather than c-axis properties.

An objective of this invention is to grow a buffer on an iridium-composite bottom electrode, followed by growing a BTO thin film on the buffer layer, to enhance the growth of c-axis BTO thin film.

Figure 1:
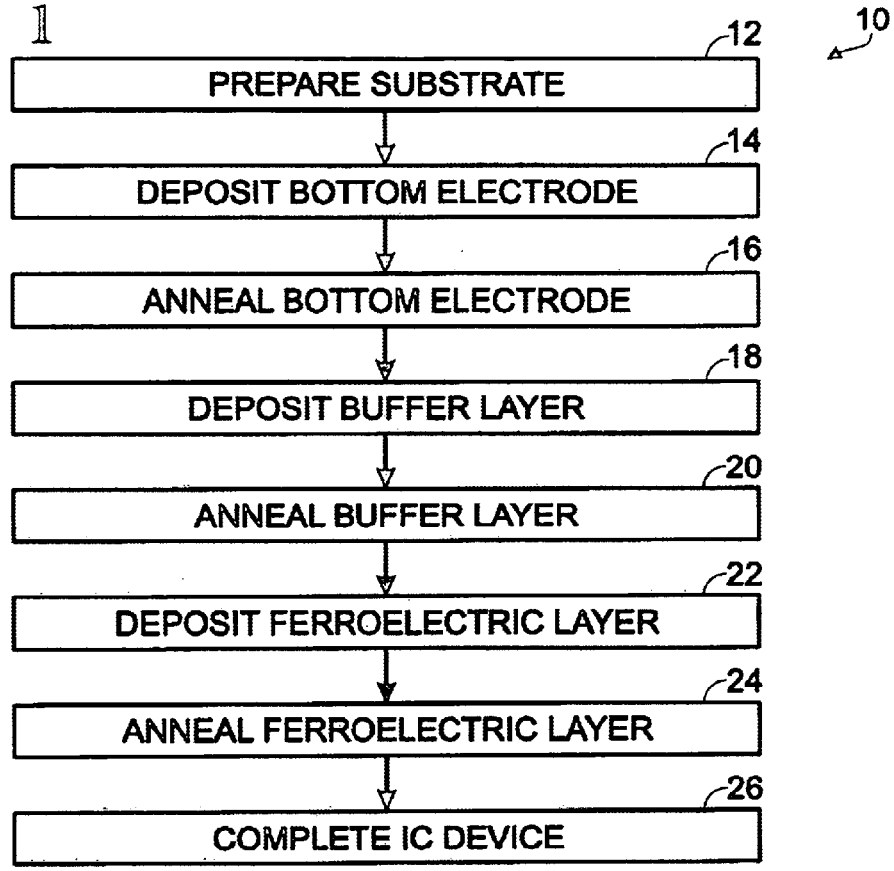
FIG. 1 is a block diagram of the method of the invention.

Referring to FIG. 1, the method of the invention is depicted generally at 10. The preparation of an iridium-composite bottom electrodes has been described in the above cited patents. Initially, a substrate is prepared, 12, which may be a bulk silicon substrate, a SIMOX substrate, of a partially completed IC device. A Ir—Ta—O bottom electrode may be deposited 14 by co-sputtering iridium and tantalum targets in an argon and oxygen ambient atmosphere. After deposition of the iridium-composite electrode, an oxygen annealing 16, a first annealing step, of the electrode at between about 600° C. to 800° C. for between about five minutes to one hour is necessary to stabilize the conductivity and phase of the electrode.

After annealing, a buffer layers such as $HfO_2$, $ZrO_2$, $TiO_2$, $LaO_x$, La—Al—O, Ti—Al—O, Hf—Al—O, Zr—Al—O, Hf—Zr—O, Zr—Ti—O, Hf—Ti—O, La—Zr—O, La—Hf—O, and La—Ti—O, is deposited 18 on the iridium-composite electrode. The thickness of the buffer layers range from about 3 nm to 30 nm. The deposition methods include physical vapor deposition, e.g., sputtering, e-beam evaporation, CVD, PECVD and ALCVD.

After a buffer layer is deposited, another annealing, a second annealing step, in an oxygen ambient 20 is performed at between about 400° C. to 800° C. for between about one minute to one hour in order to fully oxidize the buffer layer. The BTO thin film is deposited 22 on the buffer layer to a thickness of between about 20 nm to 500 nm, and annealed in an oxygen ambient atmosphere 24, a third annealing step, at between about 600° C. to 800° C. for between about five minutes to twelve hours. The deposition methods included PVD, such as sputtering, CSD, such as spin deposition, and MOCVD. The IC device is completed according to state-of-the-art techniques.

Example of the Method of the Invention

An Ir—Ta—O bottom electrode was deposited on a substrate by sputtering. A $HfO_2$ thin film layer was deposited on the Ir—Ta—O bottom electrode by sputtering a Hf target in an argon and oxygen ambient atmosphere at room temperature. The power used on the four-inch Hf target was 300W and the $ArO_2$ ratio was 5:2. The base pressure was $5 \times 10^{-7}$ torr and the deposition pressure was 7 mtorr. The thickness of the resultant $HfO_2$ buffer layer was about 10 nm. After the $HfO_2$ buffer layer deposition, the substrate was annealed in an oxygen ambient atmosphere at 500° C. for about 1 min. The BTO thin film was deposited on the surface of $HfO_2$ buffer layer, using a BTO spin-coating precursor solution prepared using $Ti(OPri)_4$, $Bi(OAc)$, acetic acid and 2-methoxyethanol as raw chemicals. The final BTO spin-coating precursor solution was bismuth titanium 2-methoxyethanol solution, with a trace of acetic acid. The spin speed was 2500 rpm, the baking temperature was 250° C. and the annealing temperature, after each coating layer, was 800° C. for about 10 min. XRD was used to characterize the phases of PGO thin film.

Figure 2:
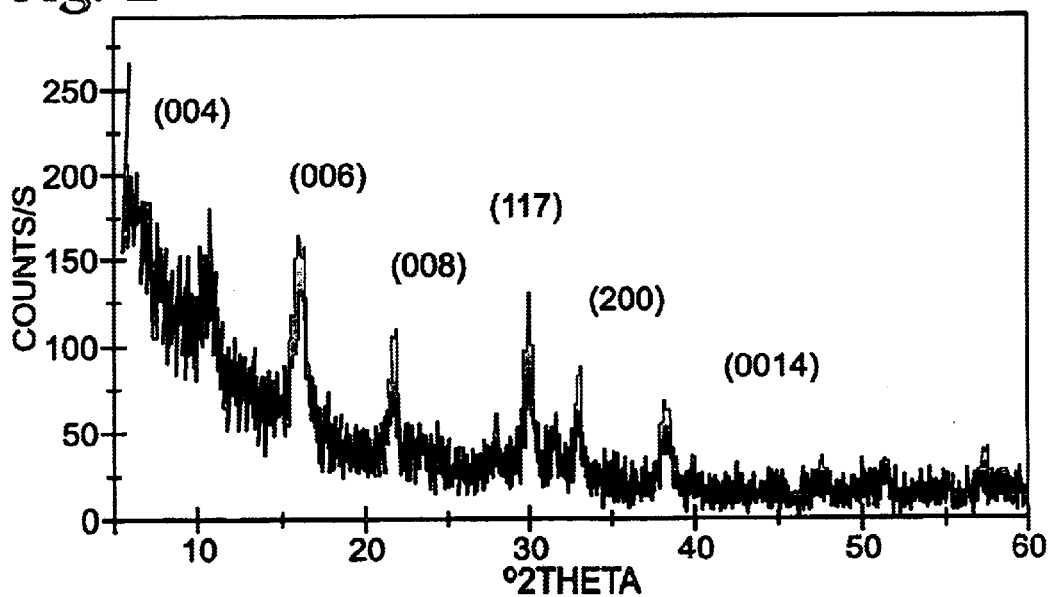
FIG. 2 depicts the XRD spectrum of BTO thin film on a $HfO_2$ substrate.
Figure 3:
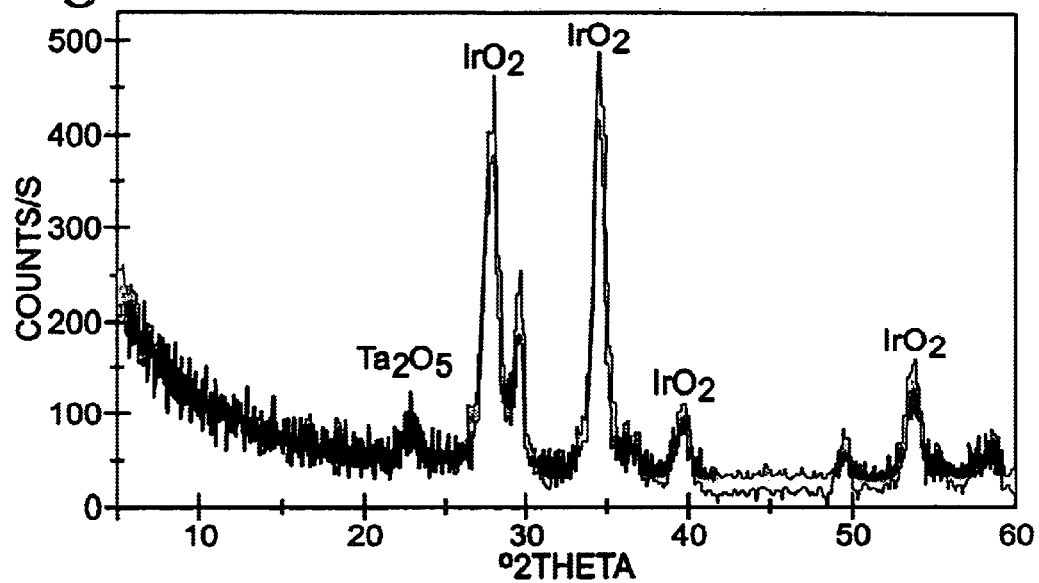
FIG. 3 depicts the XRD spectrum of BTO thin film on Ir—Ta—O substrate.
Figure 4:
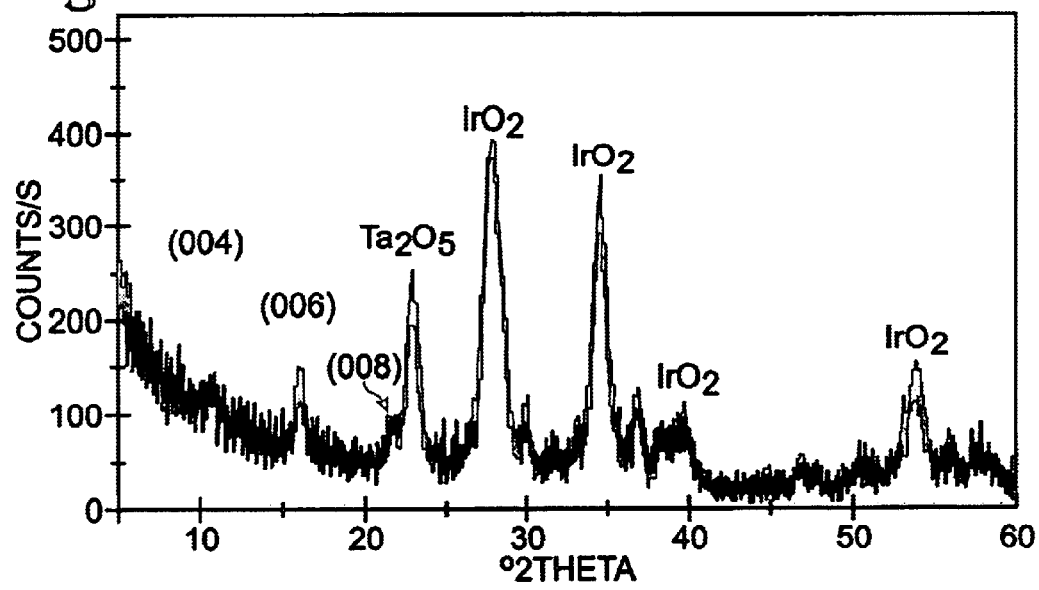
FIG. 4 depicts the XRD spectrum of c-axis BTO thin film on an Ir—Ta—O electrode with $HfO_2$ as the buffer layer.

FIG. 2 depicts the XRD spectrum of BTO thin film deposited on $HFO_2$ substrate. It can be seen that C-axis BTO thin film have been obtained. FIG. 3 depicts the XRD spectrum of BTO thin film deposited directly on an Ir—Ta—O bottom electrode. The BTO thin film, in this instance, is basically amorphous, rather than c-axis film. FIG. 4 depicts the XRD spectrum of BTO thin film deposited on a Ir—Ta—O bottom electrode with a $HfO_2$ buffer layer between the bottom electrode and the BTO ferroelectric layer. Compared with FIG. 3, c-axis BTO peaks are observed, which means that the $HfO_2$ buffer layer has effectively enhanced the growth of BTO thin film on the Ir—Ta—O bottom electrode.

Thus, a method of fabricating buffer layers to enhance the C-axis growth of $BL_4TI_3O_{12}$ thin film on high temperature iridium-composite electrode has been disclosed. It will be appreciated that further variations and modifications thereof may be made within the scope of the invention as defined in the appended claims.

We claim:

1. A method of fabricating a ferroelectric thin film on an iridium-composite electrode in an integrated circuit device, comprising:
   preparing a substrate;
   depositing an iridium-composite bottom electrode on the substrate;
   annealing the iridium-composite bottom electrode in a first annealing step;
   depositing a buffer layer on the iridium-composite bottom electrode;
   annealing the buffer layer in a second annealing step;
   depositing a ferroelectric layer on the buffer layer;
   annealing the ferroelectric layer in a third annealing step; and
   completing the integrated circuit device.

2. The method of claim 1 wherein the iridium-composite bottom electrode is deposited by co-sputtering iridium and tantalum targets in an argon and oxygen ambient atmosphere.

3. The method of claim 1 wherein said first annealing step includes oxygen annealing of the iridium-composite bottom electrode at between about 600° C. to 800° C. for between about five minutes to one hour.

4. The method of claim 1 wherein said depositing a buffer layer includes depositing a layer of material taken from the group of materials consisting of $HfO_2$, $ZrO_2$, $TiO_2$, $LaO_x$, La—Al—O, Ti—Al—O, Hf—Al—O, Zr—Al—O, Hf—Zr—O, Hf—Zr—O, Zr—Ti—O, Hf—Ti—O, La—Zi—O, La—Hf—O, and La—Ti—O.

5. The method of claim 4 wherein said depositing a layer of buffer material includes depositing a layer of buffer material to a thickness of between about 3 nm to 30 nm.

6. The method of claim 4 wherein said depositing a layer of buffer material includes depositing by a technique taken from the group of techniques consisting of physical vapor deposition, sputtering, e-beam evaporation, CVD, PECVD and ALCVD.

7. The method of claim 1 wherein said second annealing step includes about one minute to one hour.

8. The method of claim 1 wherein said depositing a layer of ferroelectric material includes depositing a layer of $Bi_4Ti_3O_{12}$ to a thickness of between about 20 nm to 500 nm.

9. The method of claim 1 wherein said third annealing step annealing in an oxygen ambient atmosphere at between about 600° C. to 800° C. for between about five minutes to twelve hours.

10. A method of fabricating a ferroelectric thin film on an iridium-composite electrode in an integrated circuit device, comprising:
   preparing a substrate;
   depositing an iridium-composite bottom electrode in a first annealing step;
   depositing a buffer layer on the iridium-composite bottom electrode, including depositing a layer of material taken from the group of materials consisting of $HfO_2$, $ZrO_2$, $TiO_2$, $LaO_x$, La—Al—O, Ti—Al—O, Hf—Al—O, Zr—Al—O, Hf—Zr—O, Zr—Ti—O, Hf—Ti—O, La—Zr—O, La—Hf—O, and La—Ti—O;
   annealing the buffer layer in a second annealing step;
   depositing a ferroelectric layer of $Bi_4Ti_3O_{12}$, to a thickness of between about 20 nm to 500 nm, on the buffer layer;
   annealing the ferroelectric layer in a third annealing step; and
   completing the integrated circuit device.

11. The method of claim 10 wherein the iridium-composite bottom electrode is deposited by co-sputtering iridium and tantalum targets in an argon and oxygen ambient temperature.

12. The method of claim 10 wherein said first annealing step includes oxygen annealing of the iridium-composite bottom electrode at between about 600° C. to 800° C. for between about five minutes to one hour.

13. The method of claim 10 wherein said depositing a layer of buffer material includes depositing a layer of buffer material to a thickness of between about 3 nm to 30 nm.

14. The method of claim 10 wherein said depositing a layer of buffer material includes depositing by a technique taken from the group of techniques consisting of physical vapor deposition, sputtering, e-beam evaporation, CVD, PECVD and ALCVD.

15. The method of claim 10 wherein said second annealing step includes annealing in an oxygen ambient 20 is performed at between about 400° C. to 800° C. for between about one minute to one hour.

16. The method of claim 10 wherein said third annealing step annealing in an oxygen ambient atmosphere at between about 600° C. to 800° C. for between about five minutes to twelve hours.

* * * * *